United States Patent
Sasaki et al.

(10) Patent No.: US 11,637,236 B2
(45) Date of Patent: Apr. 25, 2023

(54) SPIN-ORBIT TORQUE MAGNETORESISTANCE EFFECT ELEMENT AND MAGNETIC MEMORY

(71) Applicant: TDK CORPORATION, Tokyo (JP)

(72) Inventors: Tomoyuki Sasaki, Tokyo (JP); Atsushi Tsumita, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/269,173

(22) PCT Filed: Feb. 1, 2019

(86) PCT No.: PCT/JP2019/003628
§ 371 (c)(1),
(2) Date: Feb. 17, 2021

(87) PCT Pub. No.: WO2020/157958
PCT Pub. Date: Aug. 6, 2020

(65) Prior Publication Data
US 2021/0184105 A1 Jun. 17, 2021

(51) Int. Cl.
*H01L 43/04* (2006.01)
*H01L 27/22* (2006.01)
*H01L 43/06* (2006.01)

(52) U.S. Cl.
CPC ............ *H01L 43/04* (2013.01); *H01L 27/228* (2013.01); *H01L 43/065* (2013.01)

(58) Field of Classification Search
CPC ..... H01L 43/04; H01L 27/228; H01L 43/065; H01L 27/226; H01L 43/06; H01L 43/14
See application file for complete search history.

(56) References Cited

U.S. PATENT DOCUMENTS 8,350,347 B2 1/2013 Gaudin et al.
2014/0269032 A1* 9/2014 Ong .................... G11C 11/1653
365/158

(Continued)

FOREIGN PATENT DOCUMENTS

| JP | 2017-216286 A | 12/2017 |
| WO | 2016/021468 A1 | 2/2016 |
| WO | 2018/052062 A1 | 3/2018 |

OTHER PUBLICATIONS

Y.K. Kato et al. "Observation of the Spin Hall Effect in Semiconductors". Science Magazine, vol. 306, Dec. 10, 2004, pp. 1910-1913.

(Continued)

*Primary Examiner* — Latanya N Crawford Eason
(74) *Attorney, Agent, or Firm* — Oliff PLC

(57) ABSTRACT

A spin-orbit torque magnetoresistance effect element according to the present embodiment includes an element part including a first ferromagnetic layer, a second ferromagnetic layer, and a nonmagnetic layer positioned between the first ferromagnetic layer and the second ferromagnetic layer, a spin-orbit torque wiring positioned in a first direction with respect to the element part, facing the first ferromagnetic layer of the element part, and extending in a second direction, a first conductive part and a second conductive part facing the spin-orbit torque wiring at positions sandwiching the element part when viewed from the first direction, and a gate part positioned between the first conductive part and the second conductive part when viewed from the first direction, facing a second surface of the spin-orbit torque wiring on a side opposite to a first surface which faces the element part, and including a gate insulating layer and a gate electrode in order from a position near the spin-orbit (Continued)

torque wiring, in which the spin-orbit torque wiring includes a semiconductor to which a scattering element is added.

12 Claims, 12 Drawing Sheets

(56) References Cited

U.S. PATENT DOCUMENTS

| | | |
|---|---|---|
| 2015/0348606 A1 | 12/2015 | Buhrman et al. |
| 2017/0092844 A1 | 3/2017 | Braganca et al. |
| 2017/0222135 A1 | 8/2017 | Fukami et al. |
| 2019/0148046 A1 | 5/2019 | Suzuki |
| 2019/0267542 A1* | 8/2019 | Komura ............... H01L 43/14 |
| 2021/0233577 A1* | 7/2021 | Saito ................... H01L 29/82 |

OTHER PUBLICATIONS

Ioan Mihai Miron et al. "Perpendicular Switching of a Single Ferromagnetic Layer Induced by In-Plane Current Injection". Nature, vol. 476, Aug. 11, 2011, pp. 189-194.
Luqiao Liu et al. "Spin Torque Switching With the Giant Spin Hall Effect of Tantalum". Science Magazine, vol. 336 and 555, Mar. 13, 2012, pp. 1-18 and 1-12.
Luqiao Liu et al. "Current-Induced Switching of Perpendicularly Magnetized Magnetic Layers Using Spin Torque From the Spin Hall Effect". Physical Review Letters, vol. 109, Aug. 31, 2012, pp. 096602-1 through 096602-5.
Ki-Seung Lee et al. "Threshold Current for Switching of a Perpendicular Magnetic Layer Nduced by Spin Hall Effect". Applied Physics Letters, vol. 102, 2013, pp. 112410-1 through 112410-5.
Ki-Seung Lee et al. "Thermally Activated Switching of Perpendicular Magnet by Spin-Orbit Spin Torque". Applied Physics Letters, vol. 104, 2014, pp. 072413-1 through 072413-5.
Shunsuke Fukami et al. "Magnetization Switching by Spin-Orbit Torque in an Antiferromagnet-Ferromagnet Bilayer System". Nature Materials, vol. 15, May 2016, pp. 535-542.
S. Fukami et al. "A Spin-Orbit Torque Switching Scheme With Collinear Magnetic Easy Axis and Current Configuration". Nature Nanotechnology, Mar. 21, 2016, pp. 1-6.
S. Takahashi et al. "Spin Injection and Detection in Magnetic Nanostructures". Physical Review B, vol. 67, 2003, pp. 052409-1 through 052409-4.
Yeongkyo Seo et al. "Area-Efficient SOT-MRAM With a Schottky Diode". IEEE Electron Device Letters, vol. 37, No. 8, Aug. 2016, pp. 982-985.
Wei Zhang et al. "Spin Hall Effects in Metallic Antiferromagnets". Physical Review Letters, vol. 113, Nov. 7, 2014, pp. 196602-1 through 196602-6.
Sato et al., "Perpendicular-anisotropy CoFeB—MGO magnetic tunnel junctions with a MgO/CoFeB/Ta/CoFeB/MgO recording structure," Applied Physics Letters, 2012, vol. 101, pp. 022414-1-022414-4.
Liu et al., "Magnetic Oscillations Driven by the Spin Hall Effect in 3-Terminal Magnetic Tunnel Junction Devices," Physical Review Letters, 2012, vol. 109, pp. 186602-1-186602-5.
Kimura et al., "Electrical Control of the Direction of Spin Accumulation," Physical Review Letters, 2007, vol. 99, pp. 166601-1-166601-4.
Apr. 9, 2019 International Search Report issued in International Patent Application No. PCT/JP2019/003628.

\* cited by examiner

SPIN-ORBIT TORQUE MAGNETORESISTANCE EFFECT ELEMENT AND MAGNETIC MEMORY

TECHNICAL FIELD

The present invention relates to a spin-orbit torque magnetoresistance effect element and a magnetic memory.

BACKGROUND ART

Magnetoresistance effect elements are expected to be applied to magnetic sensors, high frequency components, magnetic heads, and magnetic random-access memories (MRAM).

A magnetoresistance effect element outputs a change in relative magnetization direction of two ferromagnetic layers sandwiching a nonmagnetic layer as a change in resistance of the element. The magnetoresistance effect element controls magnetization directions of the ferromagnetic layers and records data. As a method of controlling a magnetization direction, a method utilizing a magnetic field generated by a current, and a method utilizing a spin transfer torque (STT) generated when a current is caused to flow in a lamination direction of a magnetoresistance effect element are known. The method utilizing the STT needs to apply a potential difference in a direction through a nonmagnetic layer, and this may cause damage to the nonmagnetic layer.

In recent years, a method utilizing a spin-orbit torque (SOT) has been studied as a new method for controlling a magnetization direction (for example, Patent Document 1). An SOT is induced in a ferromagnetic layer by a spin current generated by a spin-orbit interaction or a Rashba effect at an interface between different materials. An SOT acts upon magnetization in a ferromagnetic layer and reverses the magnetization of the ferromagnetic layer. The spin current and the Rashba effect occur when a current flows in a direction intersecting a lamination direction of ferromagnetic layers. In a method using the SOT, the flow of a large write current in a lamination direction of a nonmagnetic layer and a ferromagnetic layer can be avoided, and damage to the nonmagnetic layer or the like can be suppressed.

CITATION LIST

Patent Literature

[Patent Document 1]
Japanese Unexamined Patent Application, First Publication No. 2017-216286

SUMMARY OF INVENTION

Technical Problem

Magnetoresistance effect elements serve as a recording region for recording data and are often used as a magnetic memory in which a plurality of magnetoresistance effect elements are integrated. In order to achieve a reduction in size of the entire magnetic memory, it is required to enhance integration of the magnetoresistance effect elements.

The present invention has been made in view of the above circumstances, and an objective thereof is to provide a spin-orbit torque magnetoresistance effect element in which integration can be enhanced. Also, another objective of the present invention is to provide a highly integrated magnetic memory.

Solution to Problem

The present invention provides the following means in order to solve the above-described problems.

(1) A spin-orbit torque magnetoresistance effect element according to a first aspect includes an element part including a first ferromagnetic layer, a second ferromagnetic layer, and a nonmagnetic layer positioned between the first ferromagnetic layer and the second ferromagnetic layer, a spin-orbit torque wiring positioned in a first direction with respect to the element part, facing the first ferromagnetic layer of the element part, and extending in a second direction, a first conductive part and a second conductive part facing the spin-orbit torque wiring at positions sandwiching the element part when viewed from the first direction, and a gate part positioned between the first conductive part and the second conductive part when viewed from the first direction, facing a second surface of the spin-orbit torque wiring on a side opposite to a first surface which faces the element part, and including a gate insulating layer and a gate electrode in order from a position near the spin-orbit torque wiring, in which the spin-orbit torque wiring includes a semiconductor.

(2) The spin-orbit torque magnetoresistance effect element according to the above-described aspect may further include a via wiring connected to the second ferromagnetic layer of the element part and extending in the first direction, and a first transistor electrically connected to the element part by the via wiring.

(3) In the spin-orbit torque magnetoresistance effect element according to the above-described aspect, the semiconductor constituting the spin-orbit torque wiring may be any one selected from the group consisting of Si, SiGe, GaAs, Ge, and InGaAs.

(4) In the spin-orbit torque magnetoresistance effect element according to the above-described aspect, the spin-orbit torque wiring may contain a scattering element.

(5) In the spin-orbit torque magnetoresistance effect element according to the above-described aspect, the scattering element may be a heavy metal element having an atomic number equal to or higher than that of yttrium.

(6) In the spin-orbit torque magnetoresistance effect element according to the above-described aspect, the scattering element may be a magnetic element.

(7) A magnetic memory according to a second aspect includes a plurality of spin-orbit torque magnetoresistance effect elements according to the above-described aspect.

(8) In the magnetic memory according to the above-described aspect, the plurality of spin-orbit torque magnetoresistance effect elements may include a first element row in which the spin-orbit torque magnetoresistance effect elements are disposed in the second direction, and two spin-orbit torque magnetoresistance effect elements adjacent to each other in the second direction may share the second conductive part of one spin-orbit torque magnetoresistance effect element as the first conductive part of the other spin-orbit torque magnetoresistance effect element in the first element row.

(9) In the magnetic memory according to the above-described aspect, the plurality of spin-orbit torque magnetoresistance effect elements may include a first element row in which the spin-orbit torque magnetoresistance effect elements are disposed in the second direction, and spin-orbit torque wirings of the plurality of spin-orbit torque magnetoresistance effect elements constituting the first element row may be connected to each other.

(10) In the magnetic memory according to the above-described aspect, the plurality of spin-orbit torque magnetoresistance effect elements may further include a second element row in which the spin-orbit torque magnetoresistance effect elements are disposed in a third direction different from the first direction and the second direction, first conductive parts of the plurality of spin-orbit torque magnetoresistance effect elements constituting the second element row may be connected to each other, and second conductive parts of the plurality of spin-orbit torque magnetoresistance effect elements constituting the second element row may be connected to each other.

Advantageous Effects of Invention

According to the spin-orbit torque magnetoresistance effect element of the above-described aspects, integration of the element can be enhanced. Also, the size of the magnetic memory according to the above-described aspects can be reduced.

DESCRIPTION OF EMBODIMENTS

Figure 1:
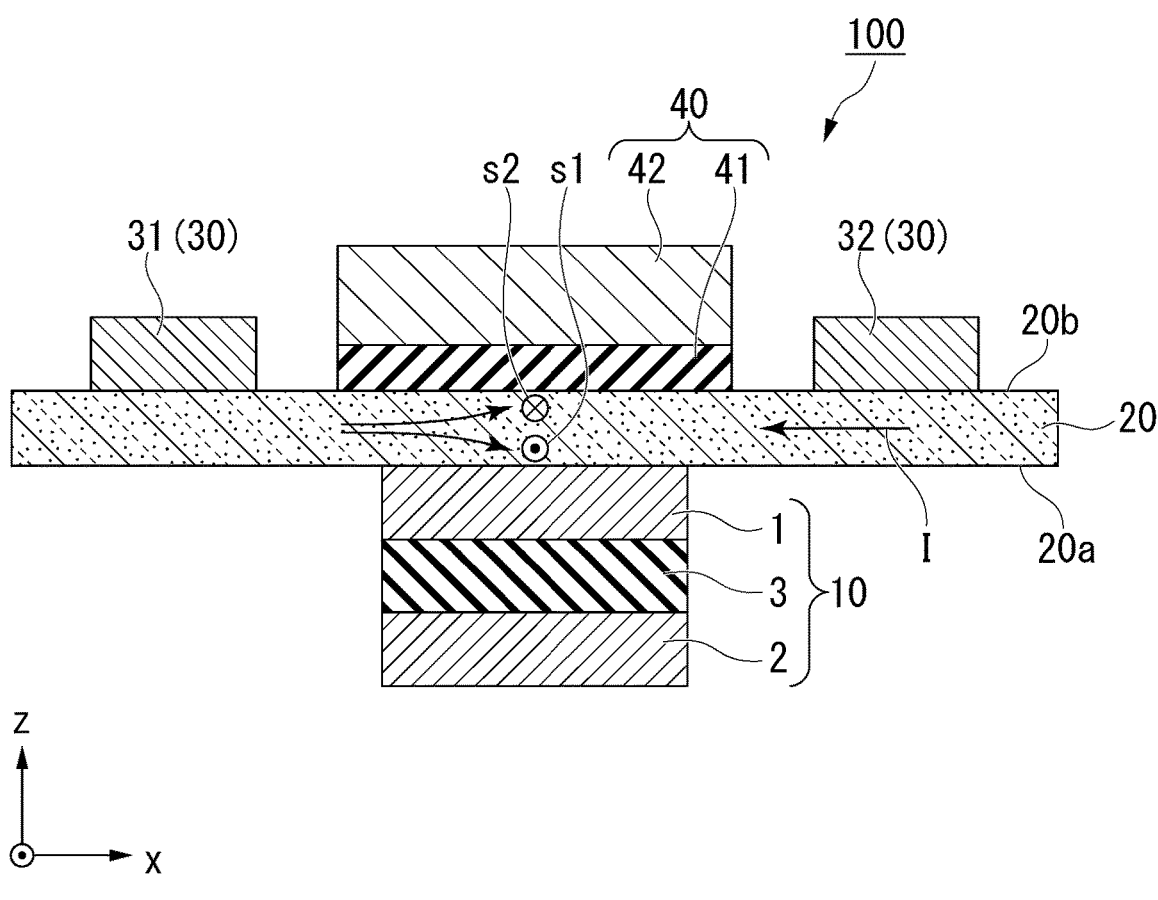
FIG. 1 is a cross-sectional view of a main part of a spin-orbit torque magnetoresistance effect element according to a first embodiment.

Hereinafter, the present embodiment will be described in detail with reference to the drawings as appropriate. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like illustrated in the following description are merely examples, and the present invention is not limited thereto and can be implemented with appropriate modifications within a range in which the effects of the present invention are achieved.

First, directions will be defined. A z direction is a direction in which a spin-orbit torque wiring 20 is positioned with respect to an element part 10 to be described below. An x direction is a direction in which the spin-orbit torque wiring to be described below extends. A y direction is a direction perpendicular to the x direction and the z direction. The z direction is an example of a first direction, the x direction is an example of a second direction, and the y direction is an example of a third direction. Also, in this specification, "extending in the x direction" means that, for example, a dimension in the x direction is larger than a minimum dimension among dimensions in the x direction, the y direction, and the z direction. The same applies to cases of extending in other directions.

First Embodiment (Spin-Orbit Torque Magnetoresistance Effect Element)

Figure 2:
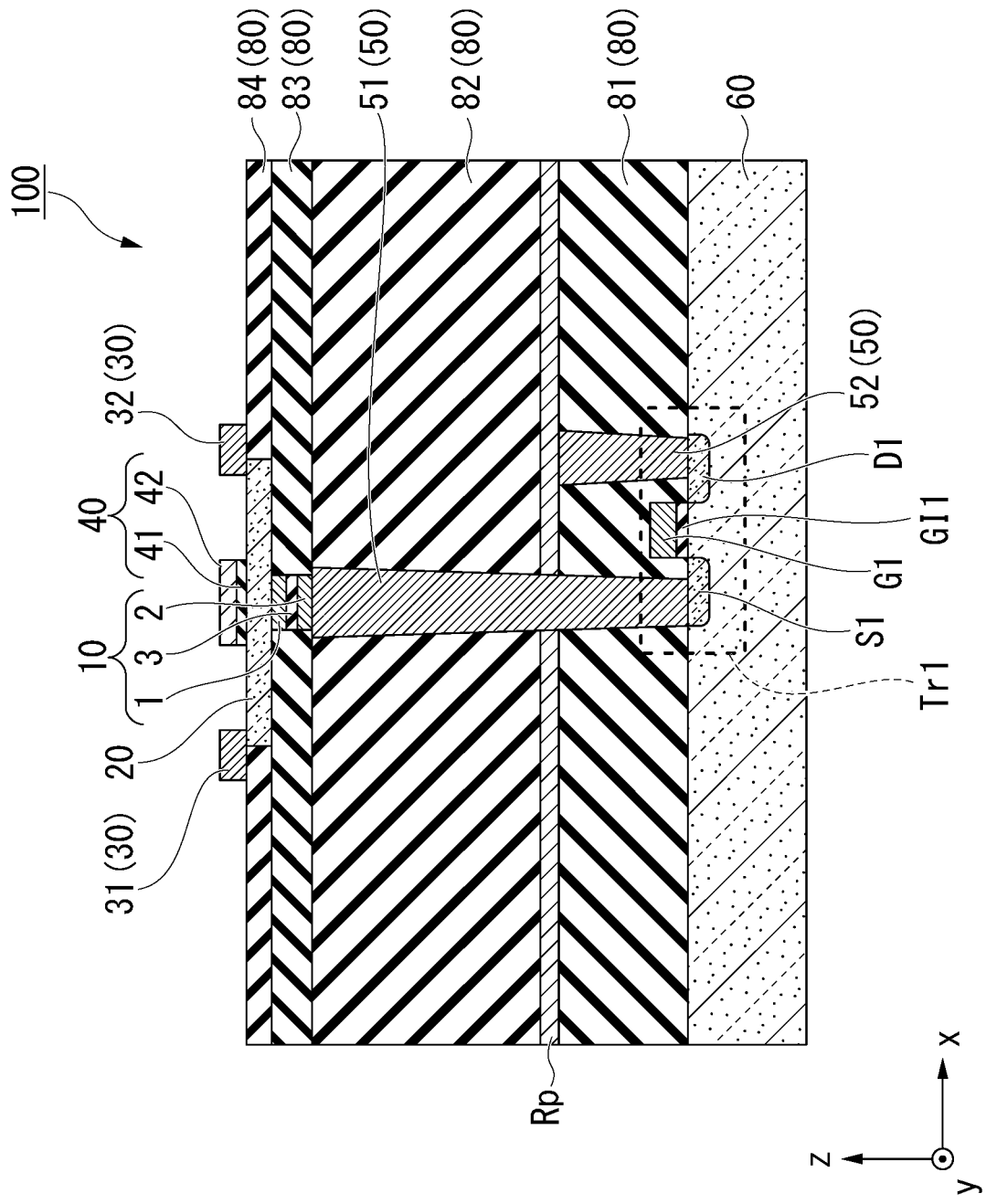
FIG. 2 is a cross-sectional view of the spin-orbit torque magnetoresistance effect element according to the first embodiment.

FIG. 1 is a cross-sectional view of a main part of a spin-orbit torque magnetoresistance effect element according to a first embodiment. FIG. 2 is a cross-sectional view of the spin-orbit torque magnetoresistance effect element according to the first embodiment. FIGS. 1 and 2 are cross sections along an xz plane passing through a center of the spin-orbit torque wiring 20 to be described below in the y direction.

A spin-orbit torque magnetoresistance effect element 100 includes the element part 10, the spin-orbit torque wiring 20, a plurality of conductive parts 30, a gate part 40, a plurality of via wirings 50, a substrate 60, and an insulating layer 80, and a read wiring Rp.

<Element Part>

The element part 10 includes a first ferromagnetic layer 1, a second ferromagnetic layer 2, and a nonmagnetic layer 3. The element part 10 faces a first surface 20a of the spin-orbit torque wiring 20. Here, "facing" refers to a relationship of facing each other, and here two layers may be in contact with each other or may have another layer therebetween. The element part 10 is a magnetoresistance effect element in which a resistance value in the z direction changes on the basis of a difference in relative angle between magnetization of the first ferromagnetic layer 1 and magnetization of the second ferromagnetic layer 2.

The element part 10 may be, for example, a columnar body. The shape of the element part 10 when viewed from the z direction is not particularly limited. The element part 10 may be, for example, circular, quadrangular, or elliptical when viewed from the z direction. Widths of the element part 10 in the x-direction and the y-direction may be constant or vary in the z-direction. For example, the widths of the element part 10 in the x-direction and the y-direction may increase or decrease with distance from the spin-orbit torque wiring 20.

The first ferromagnetic layer 1 contains a ferromagnetic material, particularly a soft magnetic material. The first ferromagnetic layer 1 may be called a magnetization free layer. The first ferromagnetic layer 1 may be, for example, a metal selected from the group consisting of Cr, Mn, Co, Fe, and Ni, an alloy containing one or more of these metals, or an alloy containing these metals and at least one element of B, C, and N. The first ferromagnetic layer 1 may be, for example, Co—Fe, Co—Fe—B, Ni—Fe, a Co—Ho alloy, a Sm—Fe alloy, an Fe—Pt alloy, a Co—Pt alloy, or a CoCrPt alloy.

The first ferromagnetic layer 1 may contain a Heusler alloy such as $Co_2FeSi$. A Heusler alloy contains an intermetallic compound having a chemical composition of XYZ or $X_2YZ$. X indicates a transition metal element from the Co, Fe, Ni, or Cu groups, or a noble metal element in the periodic table, Y indicates a transition metal of the Mn, V, Cr, or Ti groups, or types of the X element, and Z indicates a typical element from Group III to Group V. The Heusler alloy may be, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The first ferromagnetic layer 1 has an axis of easy magnetization in any direction in an xy plane or in the z direction. When the first ferromagnetic layer 1 has an axis of easy magnetization in any direction in the xy plane, the first ferromagnetic layer 1 is called an in-plane magnetic film. When the first ferromagnetic layer 1 has an axis of easy magnetization in the z direction, the first ferromagnetic layer 1 is called a perpendicular magnetization film.

The second ferromagnetic layer 2 is at a position at which, together with the first ferromagnetic material 1, it sandwiches the nonmagnetic layer 3. The second ferromagnetic layer 2 contains a ferromagnetic material. As a ferromagnetic material constituting the second ferromagnetic layer 2, for example, the same material as that of the first ferromagnetic layer 1 may be used.

The magnetization of the second ferromagnetic layer 2 does not easily move in a predetermined environment compared to the magnetization of the first ferromagnetic layer 1. The second ferromagnetic layer 2 may be called a magnetization fixed layer.

The second ferromagnetic layer 2 may be made of, for example, one ferromagnetic material. In this case, a material constituting the second ferromagnetic layer 2 is selected to have a higher coercivity than that of the first ferromagnetic layer 1.

Also, for example, the second ferromagnetic layer 2 may have a first layer, a second layer, and a third layer. The first layer and the second layer are made of a ferromagnetic material and are antiferromagnetically coupled to each other. The third layer is a nonmagnetic material sandwiched between the first layer and the second layer. The first layer and the second layer are made of the same material as the first ferromagnetic layer 1. The third layer may be made of, for example, Ru or the like. When the first layer and the second layer are antiferromagnetically coupled, the coercivity of the entire second ferromagnetic layer 2 is larger than the coercivity of the first ferromagnetic layer 1.

The nonmagnetic layer 3 is positioned between the first ferromagnetic layer 1 and the second ferromagnetic layer 2.

The nonmagnetic layer 3 is made of a nonmagnetic insulator, a nonmagnetic semiconductor, or a nonmagnetic metal. When the nonmagnetic layer 3 is made of an insulator, the element part 10 is a tunnel magnetic effect (TMR) element. When the nonmagnetic layer 3 is made of a semiconductor or a metal, the element part 10 is a giant magnetoresistance effect (GMR) element.

The nonmagnetic insulator may be, for example, a material such as $Al_2O_3$, $SiO_2$, MgO, $MgAl_2O_4$, or a material in which a part of Al, Ga, Si, and Mg of the material described above is substituted with Zn, Be, or the like. When the nonmagnetic layer 3 is made of a nonmagnetic insulator, the nonmagnetic layer 3 is a tunnel barrier layer. MgO and $MgAl_2O_4$ easily realize a coherent tunnel between the first ferromagnetic layer 1 and the second ferromagnetic layer 2. The nonmagnetic metal may be, for example, Cu, Au, Ag, or the like. Further, the nonmagnetic semiconductor may be, for example, Si, Ge, Si—Ge, $CuInSe_2$, $CuGaSe_2$, Cu(In, Ga)$Se_2$, or the like.

The element part 10 may have a layer other than the first ferromagnetic layer 1, the second ferromagnetic layer 2, and the nonmagnetic layer 3.

<Spin-Orbit Torque Wiring>

The spin-orbit torque wiring 20 is positioned in the z direction from the element part 10. The spin-orbit torque wiring 20 faces the first ferromagnetic layer 1 of the element part 10. The spin-orbit torque wiring 20 extends in the x direction across the two conductive parts 30 when viewed from the z direction.

When a potential difference is applied to both ends of the spin-orbit torque wiring 20, a current I flows along the spin-orbit torque wiring 20. A first spin s1 oriented in one direction and a second spin s2 oriented in a direction opposite to the first spin s1 are each bent in a direction perpendicular to the current. For example, the first spin s1 oriented in a +y direction is bent in a +z direction, and the second spin s2 oriented in a −y direction is bent in a −z direction.

A normal Hall effect and a spin Hall effect are the same in that a movement (traveling) direction of moving (traveling) charges (electrons) is bent. On the other hand, the normal Hall effect and the spin Hall effect greatly differ in that, in the normal Hall effect, charged particles moving in a magnetic field are subjected to a Lorentz force and a moving direction of the charged particles is bent, whereas in the spin Hall effect, a moving direction of charged particles is bent only due to moving electrons (only due to a flowing current) even though a magnetic field is absent.

In a nonmagnetic material (a material which is not a ferromagnet), the number of electrons of the first spin S1 and the number of electrons of the second spin S2 generated by the spin Hall effect are equal. In FIG. 1, the number of electrons of the first spin s1 directed in the +z direction and the number of electrons of the second spin s2 directed in the −z direction are equal. In this case, flows of charges cancel each other out, and an amount of current is zero. A spin current without a current is particularly referred to as a pure spin current.

When the flow of electrons in the first spin S1 is expressed as $J_\uparrow$, the flow of electrons in the second spin S2 is expressed as $J_\downarrow$, and a spin current is expressed as $J_S$, $J_S=J_\uparrow-J_\downarrow$ is defined. The spin current $J_S$ is generated in the z direction. In FIG. 1, the spin-orbit torque wiring 20 faces the element part 10. Spins are injected from the spin-orbit torque wiring 20 into the first ferromagnetic layer 1 of the element part 10. The injected spins impart a spin-orbit torque (SOT) to the magnetization of the first ferromagnetic layer 1. The magnetization of the first ferromagnetic layer 1 is reversed by the spin-orbit torque (SOT).

The spin-orbit torque wiring 20 includes a semiconductor. A semiconductor constituting the spin-orbit torque wiring 20 may be, for example, any one selected from the group consisting of Si, SiGe, GaAs, Ge, and InGaAs. The spin-orbit torque wiring may be a semiconductor to which a scattering element is added. The scattering element may be, for example, a heavy metal element having an atomic number equal to or higher than that of yttrium (Y). The scattering element may also be, for example, a magnetic element.

Semiconductors have less spin-orbit interaction than, for example, nonmagnetic heavy metals. When a semiconductor is used for the spin-orbit torque wiring 20, although spin current generation efficiency is low, if a current having a large current density is applied to the spin-orbit torque wiring 20, a sufficient torque for reversing the magnetization of the first ferromagnetic layer 1 can be applied to the magnetization of the first ferromagnetic layer 1. Also, when a scattering element is added to the semiconductor, the scattering element serves as a scattering factor of spins. When spins moving inside the spin-orbit torque wiring 20 are scattered, a spin-orbit interaction is enhanced and spin current generation efficiency with respect to a current density of the current applied to the spin-orbit torque wiring 20 is improved. As a result, when a semiconductor to which the scattering element is added is used for the spin-orbit torque wiring 20, the amount of current applied to the spin-orbit torque wiring 20 can be significantly reduced. When a semiconductor to which the scattering element is added is used for the spin-orbit torque wiring 20, if a current having a current density equivalent to that in a case in which the spin-orbit torque wiring 20 is a nonmagnetic heavy metal is applied, a sufficient torque for reversing magnetization of the first ferromagnetic layer 1 can be applied to the magnetization of the first ferromagnetic layer 1.

An amount of the scattering element added may be, for example, $1 \times 10^{13}$ cm$^{-3}$ or more and $1 \times 10^{18}$ cm$^{-3}$ or less. When the amount of the scattering element is excessively increased, the spin-orbit torque wiring 20 exhibits metallic behavior. Also, when the amount of the scattering element increases, movement of the generated spin current in the z direction is hindered by the scattering element, and the spin current generation efficiency may decrease.

<Conductive Part>

The conductive parts 30 are provided at positions sandwiching the element part when viewed from the z direction. The conductive parts 30 illustrated in FIG. 1 face a second surface 20b of the spin-orbit torque wiring 20. The second surface 20b is a surface on a side opposite to the first surface 20a facing the element part 10. The conductive parts 30 may face the first surface 20a. Hereinafter, for the sake of convenience, one of the two conductive parts 30 will be referred to as a first conductive part 31, and the other will be referred to as a second conductive part 32.

The conductive part 30 may serve as, for example, a wiring or an electrode. The conductive part 30 is made of a material having conductivity. The conductive part may be made of, for example, aluminum, copper, or silver. When the conductive part 30 serves as a wiring, the conductive parts 30 illustrated in FIG. 1 extends in the y direction.

<Gate Part>

The gate part 40 is positioned between the first conductive part 31 and the second conductive part 32 when viewed from the z direction. The gate part 40 faces the second surface 20b of the spin-orbit torque wiring 20. The gate part 40 faces the element part 10, for example with the spin-orbit torque wiring 20 interposed therebetween.

The gate part 40 includes a gate insulating layer 41 and a gate electrode 42 in order from a position near the spin-orbit torque wiring 20. The gate insulating layer 41 may be, for example, silicon oxide (SiO$_x$), silicon nitride (SiNx), silicon carbide (SiC), chromium nitride, silicon carbonitride (SiCN), silicon oxynitride (SiON), aluminum oxide (Al$_2$O$_3$), or zirconium oxide (ZrO$_x$). The gate electrode 42 is made of a material having conductivity. The gate electrode 42 may be, for example, aluminum, copper, or silver.

The width of the gate part 40 in the x direction may be larger than, for example, the width of the element part 10 in the x direction. When a voltage is applied to the gate electrode 42, a channel is formed between the first conductive part 31 and the second conductive part 32, and the first conductive part 31 and the second conductive part 32 are electrically conducted. When the width of the gate part 40 in the x direction is large, the leakage current between the first conductive part 31 and the second conductive part 32 is suppressed.

<Via Wirings>

The via wiring 50 is positioned in a first insulating layer 81 and a second insulating layer 82 (see FIG. 2). The via wiring 50 is formed in an opening provided in the first insulating layer 81 and the second insulating layer 82. The via wiring 50 may extend, for example, in the z direction. There are a plurality of via wirings 50. Hereinafter, for the sake of convenience, a via wiring 50 that electrically connects the second ferromagnetic layer 2 of the element part 10 to the substrate 60 is referred to as a first via wiring 51, and a via wiring 50 that electrically connects the read wiring Rp to the substrate 60 is referred to as a second via wiring 52.

The via wiring 50 contains a highly conductive material. The via wiring 50 may be, for example, copper, aluminum, silver, an oxide film having conductivity, a nitride film having conductivity, amorphous silicon, or the like.

<Substrate>

The substrate 60 may be, for example, a semiconductor substrate. The substrate 60 may be, for example, a silicon substrate. The substrate 60 includes a source region S1 and a drain region D1. The source region S1 and the drain region D1 are regions in which impurities have been injected into the substrate 60.

A first transistor Tr1 is formed in the vicinity of a surface of the substrate 60. The first transistor Tr1 includes the source region S1, the drain region D1, a gate electrode G1, and a gate insulating layer GI1. The first transistor Tr1 is electrically connected to the element part 10 by the first via wiring 51.

The gate electrode G1 and the gate insulating layer GI1 are positioned between the source region S1 and the drain region D1 when viewed from the z direction. The gate electrode G1 faces the surface of the substrate 60. The gate insulating layer GI1 is positioned between the substrate 60 and the gate electrode G1. The gate electrode G1 is made of the same material as the gate electrode 42, and the gate insulating layer GI1 is made of the same material as the gate insulating layer 41.

<Insulating Layer>

The insulating layer 80 is an insulating layer that insulates between wirings of multilayer wirings and between elements. The insulating layer 80 insulates the element part 10, the first transistor Tr1, and the read wiring Rp, except for the via wiring 50. The insulating layer 80 may include, for example, the first insulating layer 81, the second insulating layer 82, a third insulating layer 83, and a fourth insulating layer 84. The first insulating layer 81 is positioned between the substrate 60 and the read wiring Rp. The second insulating layer 82 covers a periphery of the first via wiring 51 at a position at which it is closer to the element part 10 than the read wiring Rp is. The third insulating layer 83 covers a periphery of the element part 10. The fourth insulating layer 84 covers a periphery of the spin-orbit torque wiring 20.

The insulating layer 80 may be made of the same material as that used for, for example, an interlayer insulating layer of a semiconductor device or the like. The insulating layer 80 may be, for example, silicon oxide (SiO$_x$), silicon nitride (SiNx), silicon carbide (SiC), chromium nitride, silicon carbonitride (SiCN), silicon oxynitride (SiON), aluminum oxide (Al$_2$O$_3$), zirconium oxide (ZrO$_x$), or the like.

Next, an operation of the spin-orbit torque magnetoresistance effect element 100 according to the first embodiment will be described.

The spin-orbit torque magnetoresistance effect element 100 controls a magnetization direction of the first ferromagnetic layer 1 to write data. Also, the spin-orbit torque magnetoresistance effect element 100 reads a change in resistance value of the element part 10 according to a difference in relative angle between the magnetization of the first ferromagnetic layer 1 and the magnetization of the second ferromagnetic layer 2 as data.

First, writing data to the spin-orbit torque magnetoresistance effect element 100 will be described. When data is written to the spin-orbit torque magnetoresistance effect element 100, first, a voltage is applied to the gate electrode 42. Since the spin-orbit torque wiring 20 is a semiconductor, when a voltage is applied to the gate electrode 42, a channel is formed between the first conductive part 31 and the second conductive part 32. The channel is a passage for electrons. When the channel is formed between the first conductive part 31 and the second conductive part 32, a current I flows through the spin-orbit torque wiring 20.

When the current I flows through the spin-orbit torque wiring 20, the first spin s1 and the second spin s2 are unevenly distributed near a surface of the spin-orbit torque wiring 20 due to the spin Hall effect. Inside the spin-orbit torque wiring 20, a spin current is generated in a direction (z direction) to eliminate the uneven distribution of the first spin s1 and the second spin s2. Some of the spins in the spin-orbit torque wiring 20 are injected into the first ferromagnetic layer 1 of the element part 10 by the spin current.

The spins injected into the first ferromagnetic layer 1 impart a spin-orbit torque (SOT) to the magnetization of the first ferromagnetic layer 1. When the spin-orbit torque is received, the magnetization of the first ferromagnetic layer 1 is rotated (reversed). When the magnetization direction of the first ferromagnetic layer 1 changes, the resistance value of the element part 10 changes, and data is written to the spin-orbit torque magnetoresistance effect element 100.

Next, reading data from the spin-orbit torque magnetoresistance effect element 100 will be described. First, a voltage is applied to the gate electrode G1 of the first transistor Tr1 and the gate electrode 42 of the gate part 40. When a voltage is applied to the gate electrode G1, the source region S1 and the drain region D1 are electrically conducted. Also, when a voltage is applied to the gate electrode 42, the first conductive part 31 or the second conductive part 32 is electrically conducted to the element part 10. When these are electric conducted, a current path is formed between the read wiring Rp and the first conductive part 31 or the second conductive part 32. The potential difference between the read wiring Rp and the first conductive part 31 or the second conductive part 32 is measured, and thereby the resistance value of the spin-orbit torque magnetoresistance effect element 100 can be obtained. The resistance value of the spin-orbit torque magnetoresistance effect element 100 changes according to the difference in relative angle between magnetizations of the first ferromagnetic layer 1 and the second ferromagnetic layer 2 of the element part 10. Therefore, data can be read from the resistance value of the spin-orbit torque magnetoresistance effect element 100.

Next, a method of manufacturing the spin-orbit torque magnetoresistance effect element 100 according to the first embodiment will be described with reference to FIG. 2.

First, the source region S1 and the drain region D1 are formed on the substrate 60. The source region S1 and the drain region D1 are formed by a known method. The gate insulating layer GI1 and the gate electrode G1 are formed between the source region S1 and the drain region D1.

Next, the first insulating layer 81 is formed to cover the substrate 60, the gate insulating layer GI1, and the gate electrode G1. An opening from a surface of the first insulating layer 81 toward the drain region D1 is formed in the first insulating layer 81. The opening is filled with a conductor to form the second via wiring 52. One surface of the second via wiring 52 and the first insulating layer 81 is preferably planarized by chemical mechanical polishing (CMP).

Next, the read wiring Rp and the second insulating layer 82 are formed on the one surface of the second via wiring 52 and the first insulating layer 81. An opening from a surface of the second insulating layer 82 toward the source region S1 is formed in the first insulating layer 81, the read wiring Rp, and the second insulating layer 82. The opening is filled with a conductor to form the first via wiring 51. One surface of the first via wiring 51 and the second insulating layer 82 is preferably planarized by chemical mechanical polishing (CMP).

Next, the element part 10 is formed at a position overlapping the first via wiring 51 when viewed from the z direction. After each layer of the element part 10 is formed, the element part 10 is processed into a predetermined shape by photolithography or the like. Then, the third insulating layer 83 is formed around the element part 10.

Next, the spin-orbit torque wiring 20 is formed at a position overlapping the element part 10 when viewed from the z direction. The spin-orbit torque wiring 20 is processed into a predetermined shape by photolithography or the like. Then, the fourth insulating layer 84 is formed around the spin-orbit torque wiring 20.

Next, the gate part 40 is formed on one surface of the spin-orbit torque wiring 20 at a position overlapping the element part 10 when viewed from the z direction. Finally, conductive parts 30 are formed at both ends of the spin-orbit torque wiring 20. The spin-orbit torque magnetoresistance effect element 100 according to the first embodiment can be obtained by such a procedure. Each layer may be formed by, for example, a sputtering method, a chemical vapor deposition (CVD) method, or the like.

According to the spin-orbit torque magnetoresistance effect element 100 of the first embodiment, integration when a plurality of elements are integrated can be enhanced.

Figure 3:
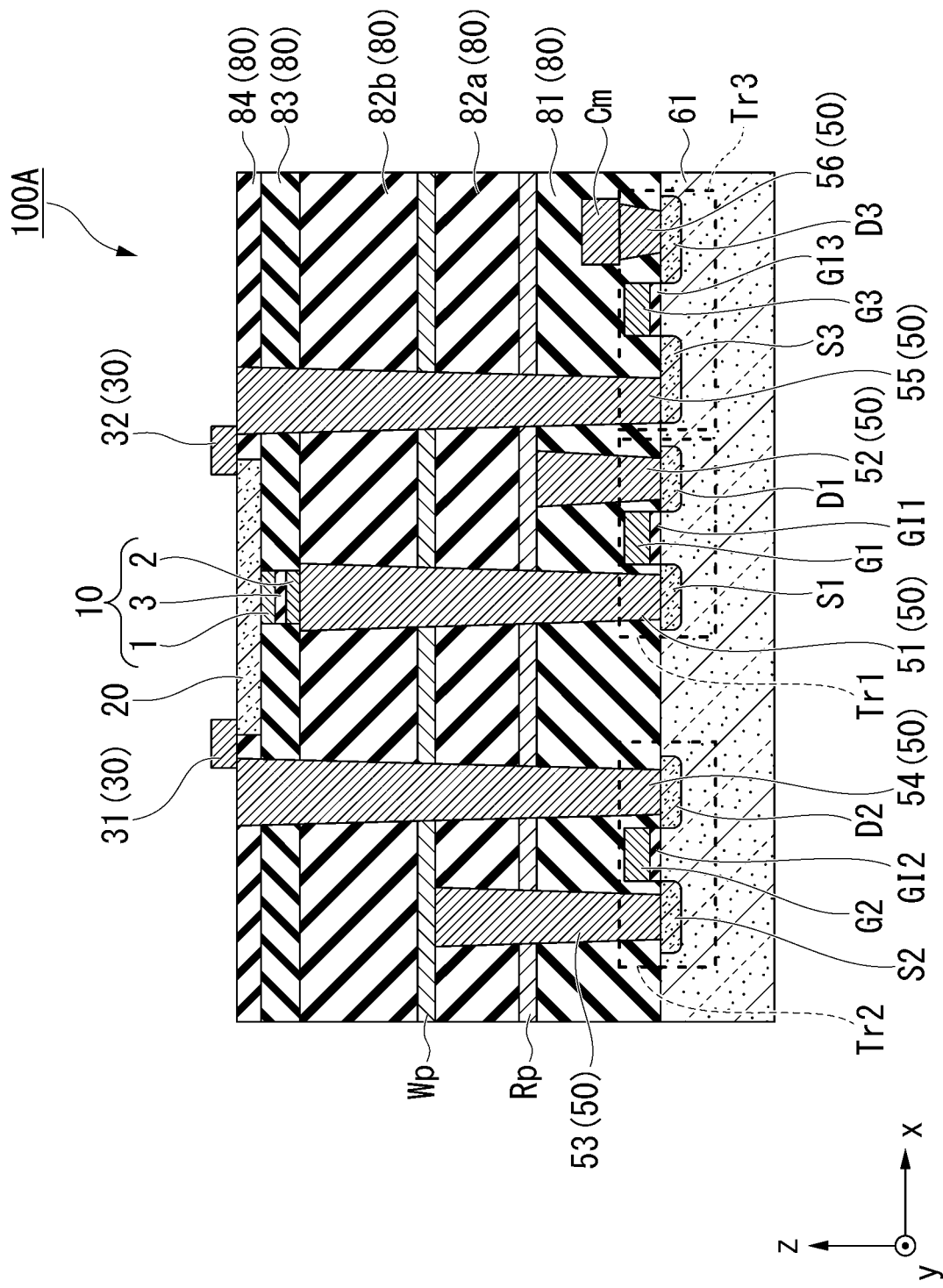
FIG. 3 is a cross-sectional view of a spin-orbit torque magnetoresistance effect element having no gate part.

FIG. 3 is a cross-sectional view of a spin-orbit torque magnetoresistance effect element 100A having no gate part 40. The spin-orbit torque magnetoresistance effect element 100A is different from the spin-orbit torque magnetoresistance effect element 100 according to the first embodiment illustrated in FIG. 2 in that the gate part 40 is not provided, a substrate 61 includes a plurality of transistors, a write wiring Wp and a common wiring Cm are provided, the second insulating layer 82 is separated into a first portion 82a and a second portion 82b by the write wiring Wp, and a third via wiring 53, a fourth via wiring 54, a fifth via wiring 55, and a sixth via wiring 56 are provided. A description of components the same as those in the spin-orbit torque magnetoresistance effect element 100 according to the first embodiment will be omitted.

The substrate 61 includes a plurality of source regions S1, S2, and S3, and a plurality of drain regions D1, D2, and D3. The plurality of source regions S1, S2, and S3, and the plurality of drain regions D1, D2, and D3 are regions in which impurities have been injected into the substrate 61. The first transistor Tr1, a second transistor Tr2, and a third transistor Tr3 are formed in the vicinity of a surface of the substrate 61. The second transistor Tr2 includes the source region S2, the drain region D2, a gate electrode G2, and a gate insulating layer GI2. The third transistor Tr3 includes the source region S3, the drain region D3, a gate electrode G3, and a gate insulating layer GI3.

The third via wiring 53 electrically connects the write wiring Wp to the source region S2. The fourth via wiring 54 electrically connects the drain region D2 to the first conductive part 31. The fifth via wiring 55 electrically connects the second conductive part 32 to the source region S3. The sixth via wiring 56 electrically connects the drain region D3 to the common wiring Cm.

For example, when the spin-orbit torque wiring 20 is made of a metal, since the first conductive part 31 and the second conductive part 32 are always electrically conducted, electric connection between the first conductive part 31 and the second conductive part 32 cannot be controlled by the gate part 40. Therefore, the spin-orbit torque magnetoresistance effect element 100A illustrated in FIG. 3 controls writing and reading of data using the three transistors (the first transistor Tr1, the second transistor Tr2, and the third transistor Tr3).

An area occupied by one transistor in the xy plane is large compared to an area occupied by the element part 10 in the xy plane. The spin-orbit torque magnetoresistance effect element 100A illustrated in FIG. 3 requires the three transistors for controlling writing and reading of data. Therefore, the spin-orbit torque magnetoresistance effect element 100A illustrated in FIG. 3 requires an area corresponding to that of the three transistors.

On the other hand, the spin-orbit torque magnetoresistance effect element 100 according to the first embodiment illustrated in FIG. 2 can control writing and reading of data with only one transistor (the first transistor Tr1). Therefore, the spin-orbit torque magnetoresistance effect element 100 illustrated in FIG. 2 can operate with an area corresponding to one transistor and is excellent in integration.

Although an example of the spin-orbit torque magnetoresistance effect element 100 according to the first embodiment has been described in detail above, additions, omissions, substitutions, and other changes to the configurations can be made within a scope not departing from the gist of the present invention.

First Modified Example

Figure 4:
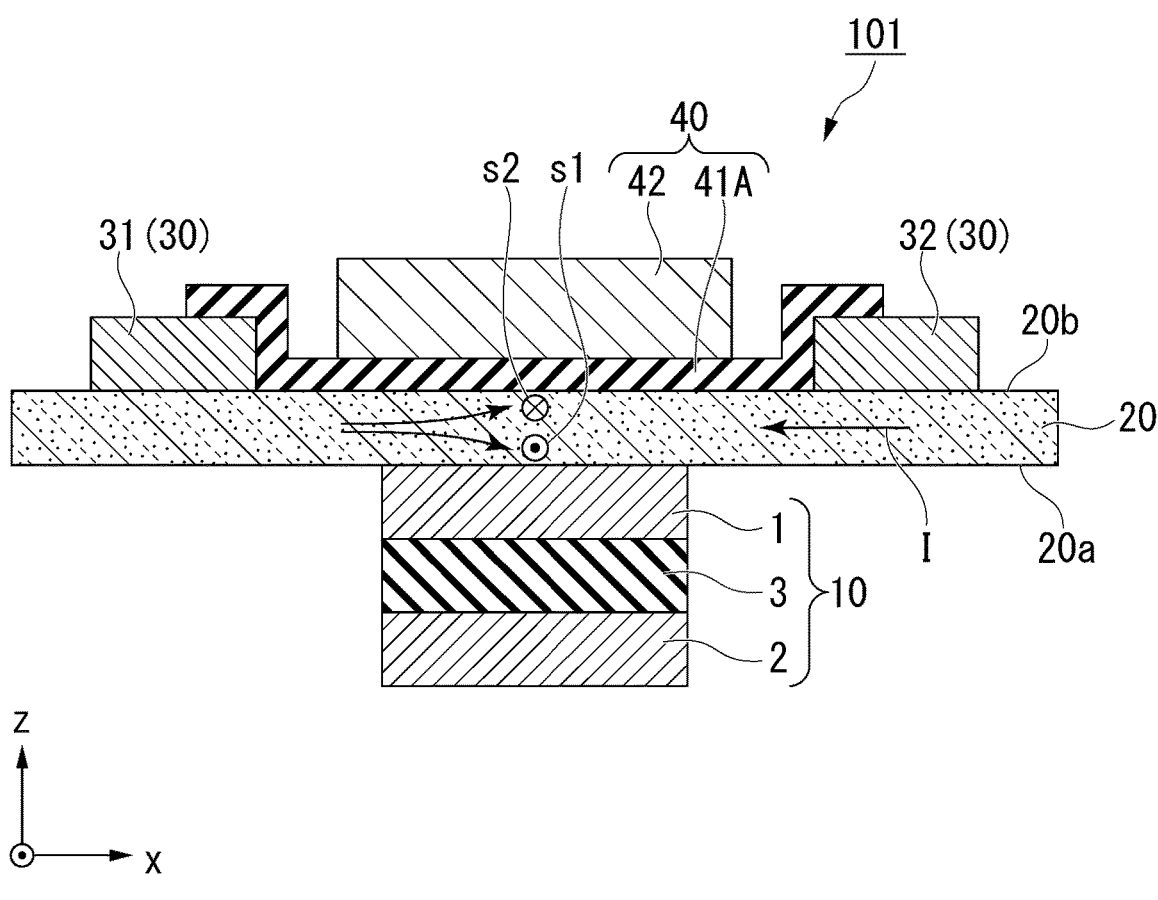
FIG. 4 is a cross-sectional view of a first modified example of the spin-orbit torque magnetoresistance effect element according to the first embodiment.

FIG. 4 is a cross-sectional view of a main part of a first modified example of the spin-orbit torque magnetoresistance effect element according to the first embodiment. Components the same as those of the spin-orbit torque magnetoresistance effect element 100 according to the first embodiment will be denoted by the same reference signs and a description thereof will be omitted.

A gate insulating layer 41A illustrated in FIG. 4 occupies a larger area than the gate electrode 42 when viewed from the z direction. The gate insulating layer 41 covers the second surface 20b of the spin-orbit torque wiring 20, and parts of the first conductive part 31 and the second conductive part 32. When the gate insulating layer 41A spans between the first conductive part 31 and the second conductive part 32, insulation between the first conductive part 31 or the second conductive part 32 and the gate electrode 42 can be enhanced.

Second Modified Example

Figure 5:
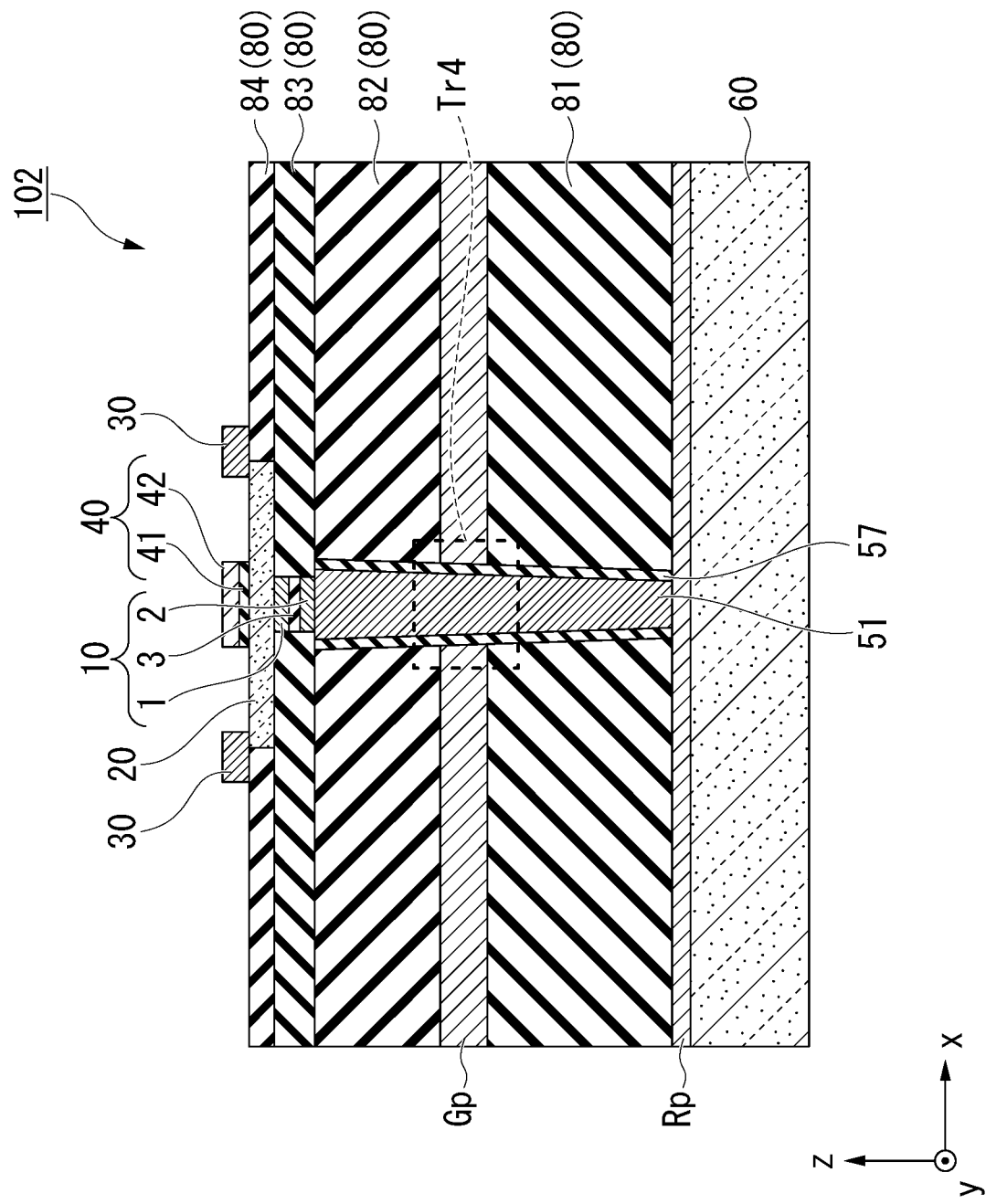
FIG. 5 is a cross-sectional view of a second modified example of the spin-orbit torque magnetoresistance effect element according to the first embodiment.

FIG. 5 is a cross-sectional view of a second modified example of the spin-orbit torque magnetoresistance effect element according to the first embodiment. Components the same as those of the spin-orbit torque magnetoresistance effect element 100 according to the first embodiment will be denoted by the same reference signs and a description thereof will be omitted.

A spin-orbit torque magnetoresistance effect element 102 illustrated in FIG. 5 has a different configuration on the substrate 60 side than the element part 10. The spin-orbit torque magnetoresistance effect element 102 includes the element part 10, the spin-orbit torque wiring 20, the plurality of conductive parts 30, the gate part 40, the first via wiring 51, an insulating film 57, the substrate 60, the plurality of insulating layers 80, the read wiring Rp, and a gate wiring Gp.

A portion in which the first via wiring 51 and the insulating film 57 intersect the gate wiring Gp functions as a fourth transistor Tr4. The insulating film 57 covers a periphery of the first via wiring 51. The insulating film 57 may be, for example, a silicon oxide. The gate wiring Gp may be made of, for example, a material having conductivity. The first via wiring 51 is a semiconductor and may be, for example, amorphous silicon.

When data is written to the spin-orbit torque magnetoresistance effect element 102, it is performed in the same manner as in the spin-orbit torque magnetoresistance effect element 100 according to the first embodiment.

When data is read from the spin-orbit torque magnetoresistance effect element 102, a voltage is applied to the gate wiring Gp and the gate electrode 42 of the gate part 40. When a voltage is applied to the gate wiring Gp, the read wiring Rp and the element part 10 are electrically connected. When a voltage is applied to the gate electrode 42, the element part 10 and the first conductive part 31 or the second conductive part 32 are electrically connected. When these are electrically conducted, a current path is formed between the read wiring Rp and the first conductive part 31 or the second conductive part 32. The potential difference between the read wiring Rp and the first conductive part 31 or the second conductive part 32 is measured, and thereby the resistance value of the spin-orbit torque magnetoresistance effect element 102 can be obtained. The resistance value of the spin-orbit torque magnetoresistance effect element 102 changes according to a difference in relative angle between magnetizations of the first ferromagnetic layer 1 and the second ferromagnetic layer 2 of the element part 10. Therefore, data can be read from the resistance value of the spin-orbit torque magnetoresistance effect element 102.

Since the spin-orbit torque magnetoresistance effect element 102 according to the second modified example 2 can also be controlled by one transistor (the fourth transistor Tr4), it is excellent in integration. Also, since the fourth transistor Tr4 is formed at a position overlapping the element part 10 in the z direction, the spin-orbit torque magnetoresistance effect element 102 can be integrated at a higher density.

Second Embodiment (Magnetic Memory)

Figure 6:
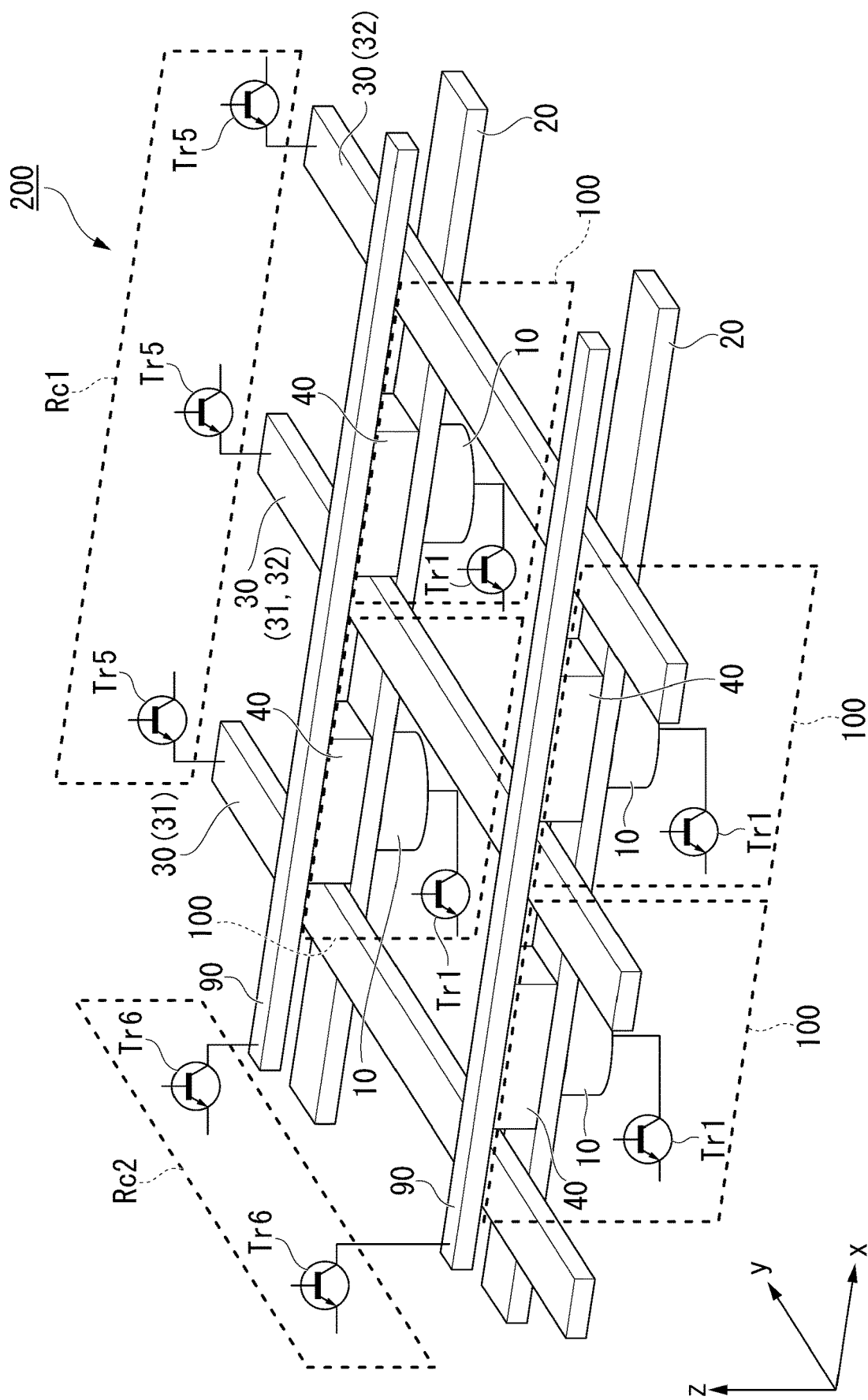
FIG. 6 is a perspective view of a part of a magnetic memory according to a second embodiment.
Figure 7:
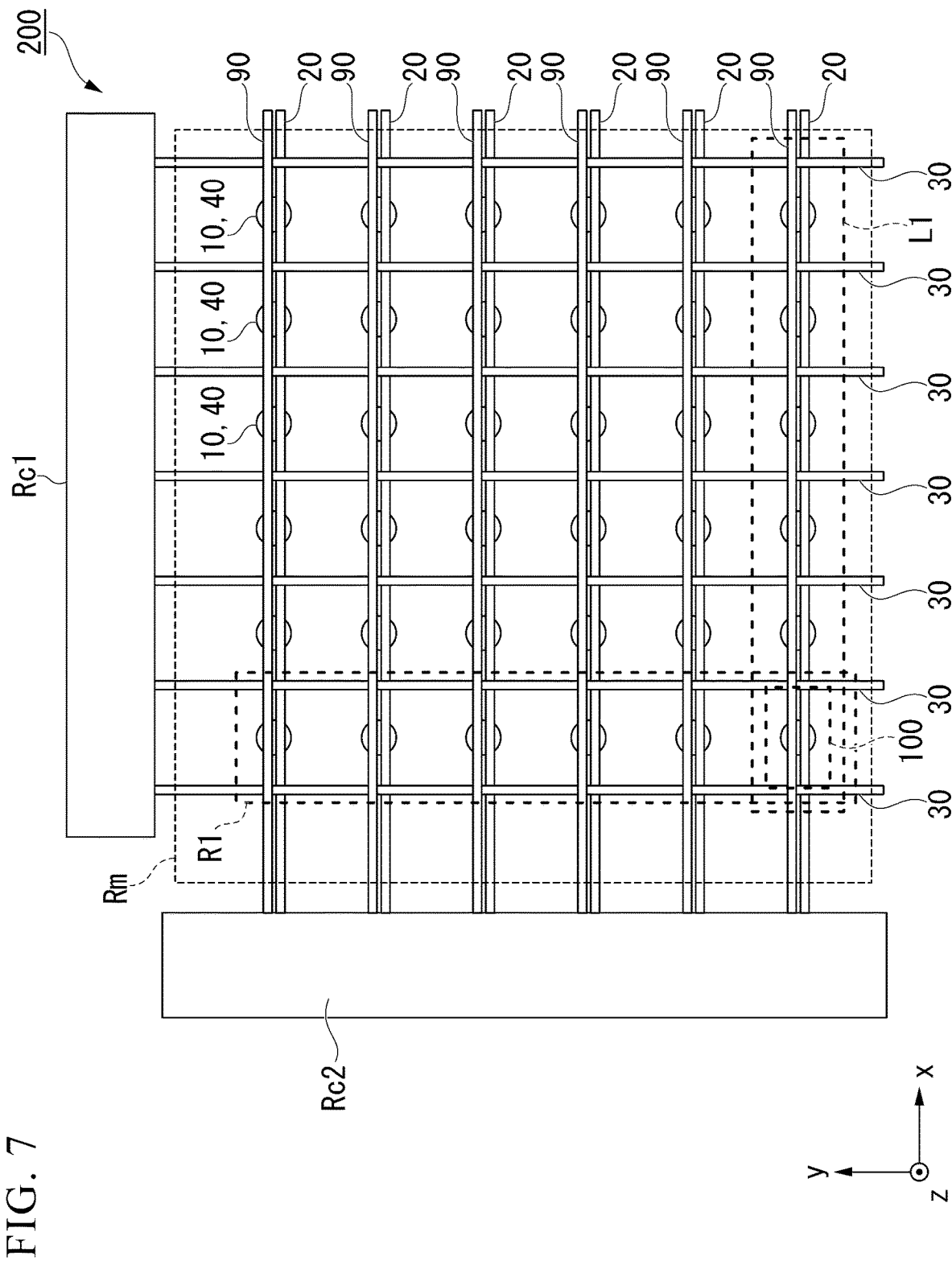
FIG. 7 is a circuit diagram of the magnetic memory according to the second embodiment.

FIG. 6 is a schematic view of a magnetic memory according to a second embodiment. FIG. 7 is a circuit diagram of the magnetic memory according to the second embodiment. A magnetic memory 200 includes a memory region Rm and peripheral circuit regions Rc1 and Rc2. The memory region Rm includes a plurality of element parts 10, a plurality of spin-orbit torque wirings 20, a plurality of conductive parts 30, a plurality of gate parts 40, and a plurality of wirings 90. Components the same as those of the spin-orbit torque magnetoresistance effect element 100 according to the first embodiment will be denoted by the same reference signs and a description thereof will be omitted.

The memory region Rm of the magnetic memory 200 includes a plurality of spin-orbit torque magnetoresistance effect elements 100. A portion including one element part 10, the spin-orbit torque wiring 20, two conductive parts 30, and one gate part 40 corresponds to the spin-orbit torque magnetoresistance effect element 100 according to the first embodiment. The plurality of spin-orbit torque magnetoresistance effect elements 100 are disposed in the x direction and the y direction. Hereinafter, a plurality of spin-orbit torque magnetoresistance effect elements 100 disposed in the x direction will be referred to as a first element row L1, and a plurality of spin-orbit torque magnetoresistance effect elements 100 disposed in the y direction will be referred to as a second element row R1.

Figure 8:
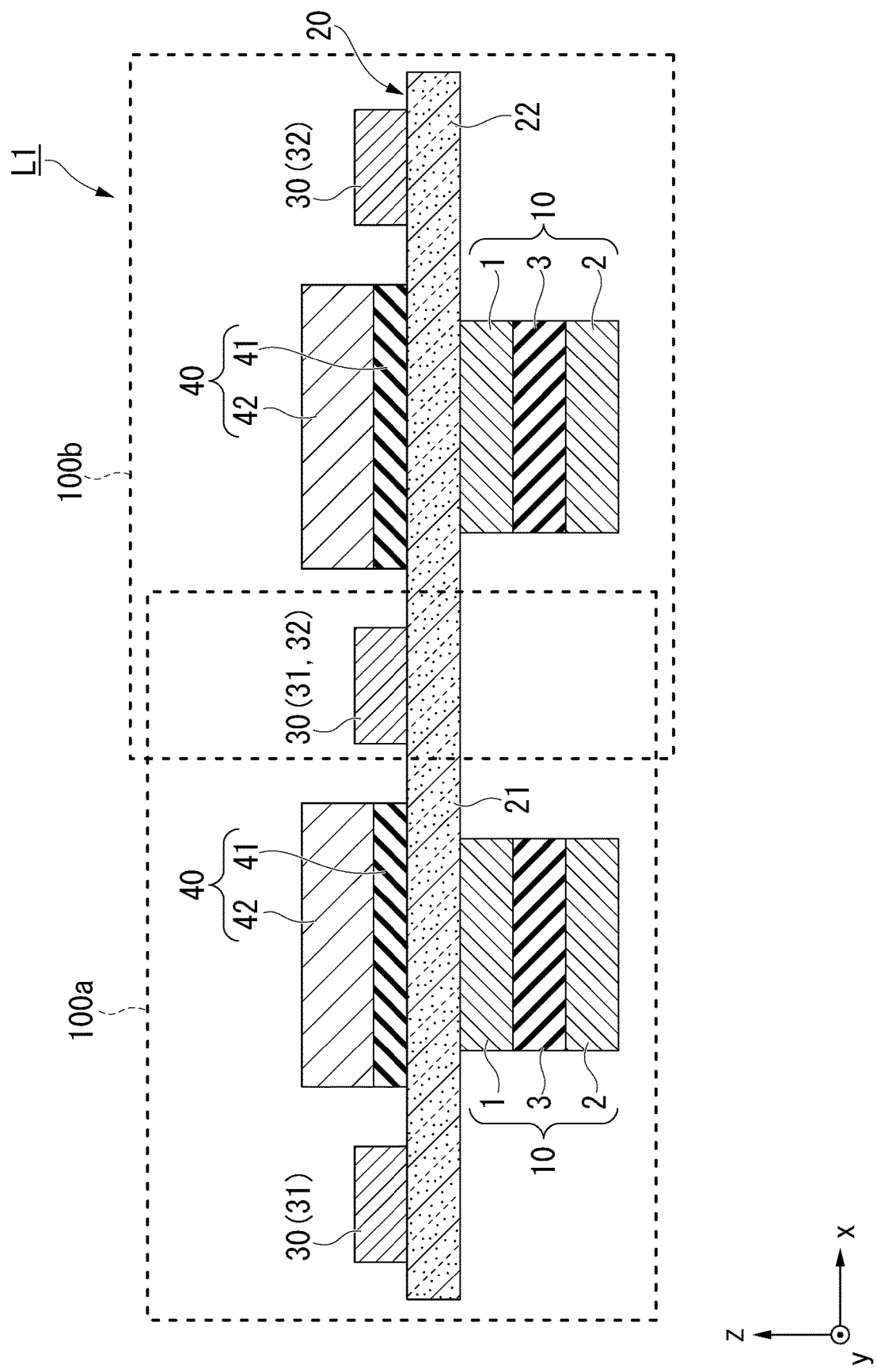
FIG. 8 is a cross-sectional view of a spin-orbit torque magnetoresistance effect element constituting the magnetic memory according to the second embodiment.

FIG. 8 is a cross-sectional view of the spin-orbit torque magnetoresistance effect element 100 constituting the magnetic memory 200 according to the second embodiment. FIG. 8 is a cross-sectional view of two spin-orbit torque magnetoresistance effect elements 100 of the first element row L1 adjacent to each other in the x direction.

Hereinafter, for sake of convenience, one of the two spin-orbit torque magnetoresistance effect elements 100 will be referred to as a first element 100*a*, and the other will be referred to as a second element 100*b*. A second conductive part 32 of the first element 100*a* functions as a first conductive part 31 of the second element 100*b*. That is, the second conductive part 32 of the first element 100*a* is shared as the first conductive part 31 of the second element 100*b*.

Also, a spin-orbit torque wiring 21 of the first element 100*a* and a spin-orbit torque wiring 22 of the second element 100*b* are connected to each other to form one spin-orbit torque wiring 20.

Also, in the second element row L2, the conductive part 30 extends across the plurality of spin-orbit torque wirings 20. The first conductive parts 31 of the plurality of spin-orbit torque magnetoresistance effect elements 100 constituting the second element row L2 are connected to each other to form one first conductive part 31. The second conductive parts 32 of the plurality of spin-orbit torque magnetoresistance effect elements 100 constituting the second element row L2 are connected to each other to form one second conductive part 32.

The peripheral circuit regions Rc1 and Rc2 are positioned on an outer side of the memory region Rm. The peripheral circuit region Rc1 includes a fifth transistor Tr5. The fifth transistor Tr5 is connected to the conductive part 30. The fifth transistor Tr5 controls a current flowing through the conductive part 30. The peripheral circuit region Rc2 includes a sixth transistor Tr6. The sixth transistor Tr6 is connected to the wiring 90. The sixth transistor Tr6 controls a current flowing through the wiring 90 and applies a voltage to a gate electrode 42 of the gate part 40.

The fifth transistor Tr5 and the sixth transistor Tr6 are positioned on an outer side of the memory region Rm. Therefore, an influence of the fifth transistor Tr5 and the sixth transistor Tr6 on integration of the magnetic memory 200 is small.

Figure 9:
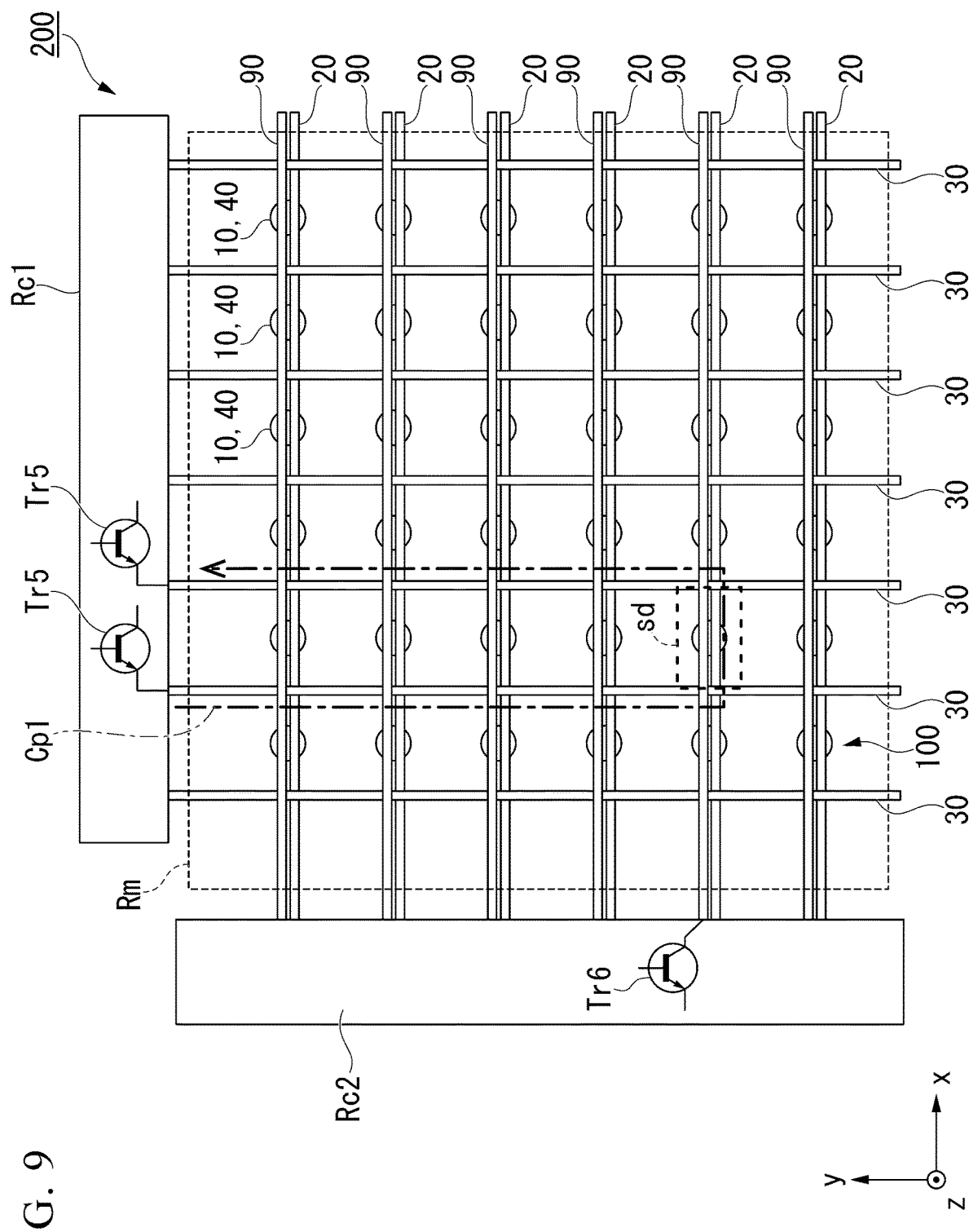
FIG. 9 is a circuit diagram showing a write operation of data to the magnetic memory according to the second embodiment.

Next, an operation of the magnetic memory 200 will be described. First, an example of a write operation of data to the magnetic memory 200 will be described. FIG. 9 is a circuit diagram showing a write operation of data to the magnetic memory 200.

A case in which data is written to one spin-orbit torque magnetoresistance effect element (hereinafter referred to as a selected element sd) among the plurality of spin-orbit torque magnetoresistance effect elements in the memory region Rm will be specifically described as an example.

A write operation of data to the selected element sd is performed, for example, by the following procedures. First, some of the fifth transistors Tr5 in the peripheral circuit region Rc1 are turned on. The fifth transistors Tr5 to be turned on are fifth transistors Tr5 connected to two conductive parts 30 that sandwich the selected element sd in closest proximity (in FIG. 9, only the fifth transistors Tr5 to be turned on are illustrated).

Next, some of the sixth transistors Tr6 in the peripheral circuit region Rc2 are turned on. The sixth transistor Tr6 to be turned on is a sixth transistor Tr6 connected to a wiring 90 connected to the selected element sd (in FIG. 9, only the sixth transistor Tr6 to be turned on is illustrated). When a current flows through the wiring 90, a voltage is applied to the gate part 40, and a channel is formed in a part of the spin-orbit torque wiring 20.

When predetermined fifth transistors Tr5 and a predetermined sixth transistor Tr6 are turned on, a current path Cp1 connecting the turned-on fifth transistors Tr5 is formed. When a current flows along the current path Cp1, magnetization of the selected element sd is rotated and data is recorded.

Figure 10:
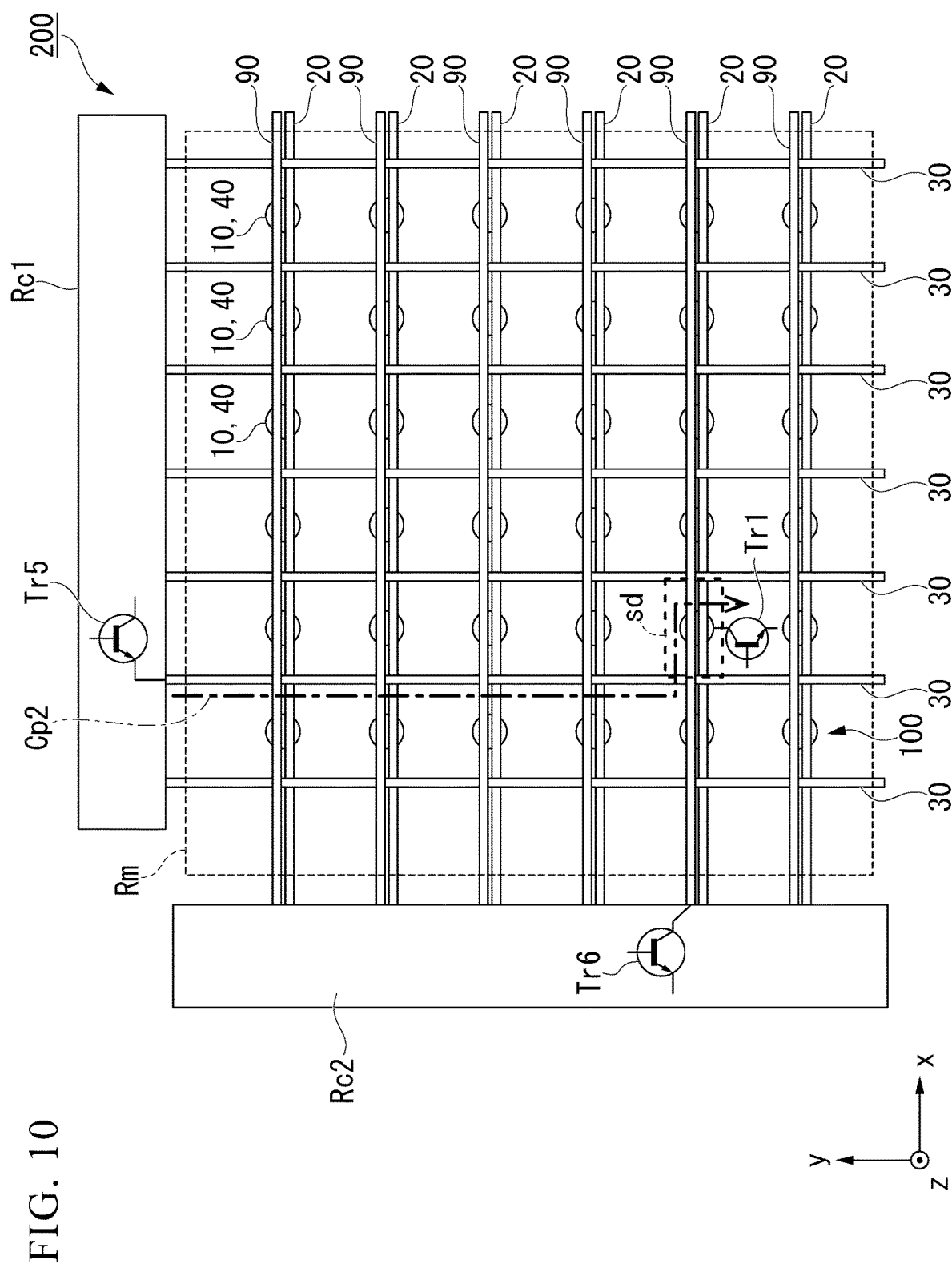
FIG. 10 is a circuit diagram showing a read operation of data from the magnetic memory according to the second embodiment.

Next, an example of a read operation of data from the magnetic memory 200 will be described. FIG. 10 is a circuit diagram showing a read operation of data from the magnetic memory 200.

A case in which data is read from one spin-orbit torque magnetoresistance effect element (hereinafter referred to as a selected element sd) among the plurality of spin-orbit torque magnetoresistance effect elements in the memory region Rm will be specifically described as an example.

A read operation of data from the selected element sd is performed, for example, by the following procedures. First, some of the fifth transistors Tr5 in the peripheral circuit region Rc1 are turned on. The fifth transistor Tr5 to be turned on is a fifth transistor Tr5 connected to either of two conductive parts 30 that sandwich the selected element sd in closest proximity (in FIG. 10, only the fifth transistor Tr5 to be turned on is illustrated).

Next, some of the sixth transistors Tr6 in the peripheral circuit region Rc2 are turned on. The sixth transistor Tr6 to be turned on is a sixth transistor Tr6 connected to a wiring 90 connected to the selected element sd (in FIG. 9, only the sixth transistor Tr6 to be turned on is illustrated). When a current flows through the wiring 90, a voltage is applied to the gate part 40, and a channel is formed in a part of the spin-orbit torque wiring 20.

Finally, a first transistor Tr1 connected to the selected element sd is turned on (in FIG. 10, only the first transistor Tr1 to be turned on is illustrated). When a predetermined fifth transistor Tr5, a predetermined sixth transistor Tr6, and a predetermined first transistor Tr1 are turned on, a current path Cp2 connecting the turned-on fifth transistor Tr5 and the turned-on first transistor Tr1 is formed. When a current is caused to flow along the current path Cp2 to obtain a potential difference in the current path Cp2, a resistance value of the selected element sd is read as data.

Also, the magnetic memory 200 can record multivalued information using the plurality of spin-orbit torque magnetoresistance effect elements 100. Generally, one spin-orbit torque magnetoresistance effect element 100 records binary data for a high resistance state and a low resistance state. The "multivalued information" means information with three or more values.

Figure 11:
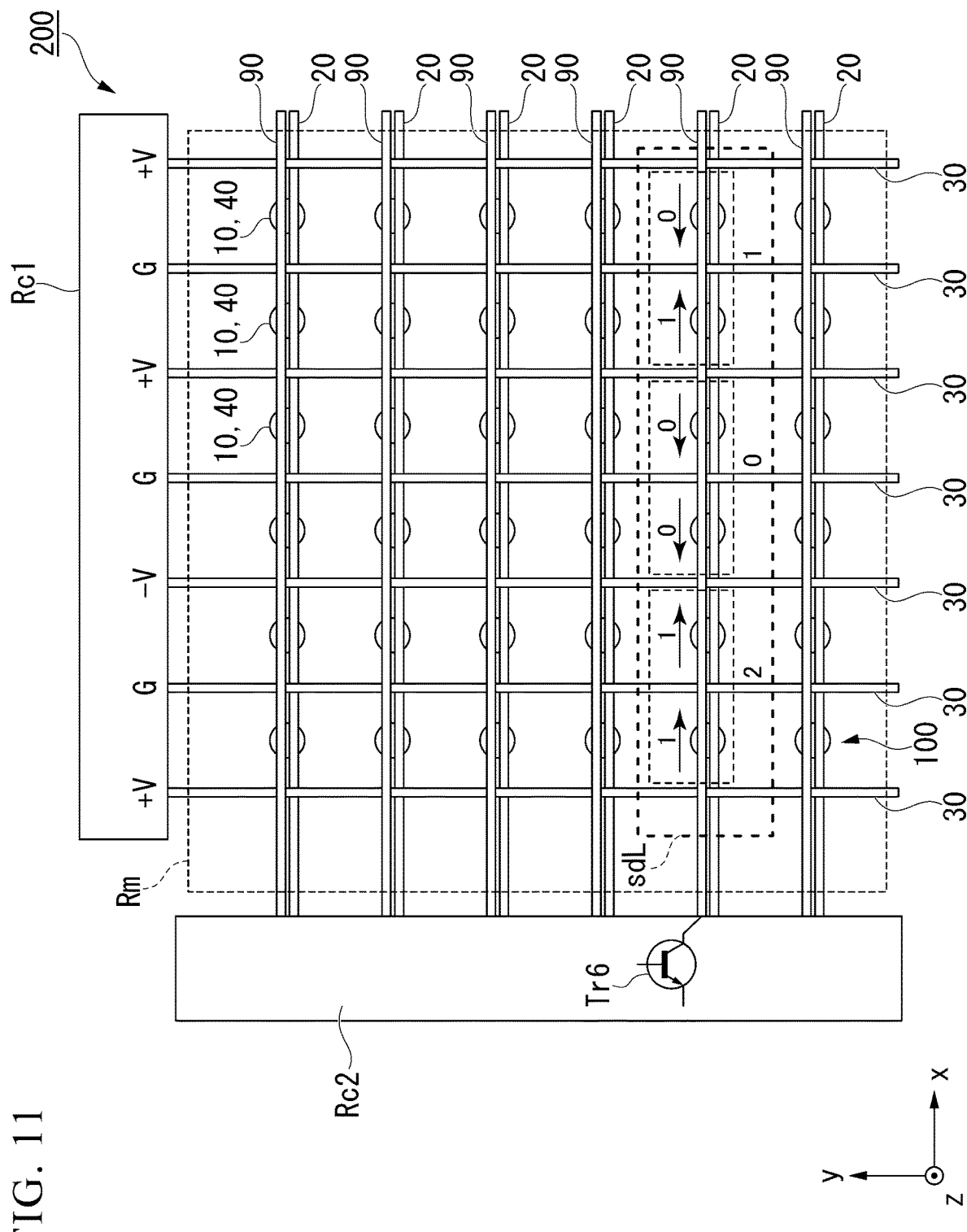
FIG. 11 is a circuit diagram showing another example of a write operation of data to the magnetic memory according to the second embodiment.

FIG. 11 is a circuit diagram showing another example of a write operation of data to the magnetic memory 200. When multivalued information is recorded, data may be written to, for example, the same element row (hereinafter, referred to as a selected element row sdL) at one time.

First, the selected element row sdL is selected. The selected element row sdL turns on a sixth transistor Tr6 connected to the selected element row sdL in the peripheral circuit region Rc2 (in FIG. 11, only the sixth transistor Tr6 to be turned on is illustrated).

Next, all the fifth transistors Tr5 in the peripheral circuit region Rc1 are turned on. At this time, potentials connected the fifth transistors Tr5 vary. For example, as illustrated in FIG. 11, potentials of the conductive parts 30 are each set to a positive potential (denoted as +V in FIG. 11), a zero potential (denoted as G in FIG. 11), a negative potential (denoted as −V in FIG. 11), a zero potential, a positive potential, a zero potential, and a positive potential in order from the left.

Tn each of the spin-orbit torque wirings 20 sandwiching two conductive parts 30, a current flows in a direction according to a potential difference. For example, in the case of FIG. 11, a current flows between two conductive parts 30 in the +X direction, the +X direction, the −x direction, the −x direction, the +X direction, and the −x direction in order from the left, respectively.

Magnetization of the first ferromagnetic layer 1 of the element part 10 changes according to a direction of the current flowing through the spin-orbit torque wiring 20. For example, when a current flows in the +X direction of the spin-orbit torque wiring 20, the magnetization of the first ferromagnetic layer 1 is antiparallel to magnetization of the second ferromagnetic layer 2. Also, for example, when a current flows in the −x direction of the spin-orbit torque wiring 20, the magnetization of the first ferromagnetic layer 1 is parallel to the magnetization of the second ferromagnetic layer 2. When the magnetization of the first ferromagnetic layer 1 and the magnetization of the second ferromagnetic layer 2 are antiparallel, a resistance value of the element part 10 increases, and then the spin-orbit torque magnetoresistance effect element 100 records information of "1." When the magnetization of the first ferromagnetic layer 1 and the magnetization of the second ferromagnetic layer 2 are parallel, a resistance value of the element part 10 decreases, and then the spin-orbit torque magnetoresistance effect element 100 records information of "0." For example, in the case of FIG. 11, the spin-orbit torque magnetoresistance effect element 100 records information of "1," "1," "0," "0," "1," and "0" in order from the left.

In a case of the recording method illustrated in FIG. 11, the magnetic memory 200 records a sum of information of two spin-orbit torque magnetoresistance effect elements 100 adjacent to each other in the x direction as one piece of information. For example, a sum of information of two leftmost spin-orbit torque magnetoresistance effect elements 100 in the selected element row sdL is "2." Also, for example, a sum of information of third and fourth spin-orbit torque magnetoresistance effect elements 100 from the left in the selected element row sdL is "0." Also, for example, a sum of information of fifth and sixth spin-orbit torque magnetoresistance effect elements 100 from the left in the selected element row sdL is "1." That is, the magnetic memory 200 can record ternary information of "2," "1," and "0."

Also, the magnetic memory 200 may also record a difference in information between two spin-orbit torque magnetoresistance effect elements 100 adjacent to each other in the x direction as one piece of information. For example, a difference in information between the two leftmost spin-orbit torque magnetoresistance effect elements 100 in the selected element row sdL is "0." Also, for example, a difference in information between the third and fourth spin-orbit torque magnetoresistance effect elements 100 in the selected element row sdL is "0." Also, for example, a difference in information between the fifth and sixth spin-orbit torque magnetoresistance effect elements 100 in the selected element row sdL is "1."

As described above, in the magnetic memory 200 according to the second embodiment, the spin-orbit torque magnetoresistance effect elements 100 are integrated with a high density. Also, two spin-orbit torque magnetoresistance effect elements 100 belonging to the first element row L1 share a conductive part 30, and thereby the number of conductive parts 30 can be reduced and integration of the magnetic memory 200 can be further enhanced.

Also, the plurality of spin-orbit torque magnetoresistance effect elements 100 belonging to the first element row L1 share the spin-orbit torque wirings 20, and the plurality of spin-orbit torque magnetoresistance effect elements 100 belonging to the second element row R1 share the conductive parts 30, and thereby the number of wirings constituting the magnetic memory 200 is reduced. Reduction in the number of wirings enhances integration of the magnetic memory 200. Also, reduction in the number of wirings facilitates manufacture of the magnetic memory 200.

Further, the magnetic memory 200 can record multivalued information depending on a data recording method.

Although an example of the magnetic memory 200 according to the second embodiment has been described in detail above, additions, omissions, substitutions, and other changes to the configurations can be made without departing from the spirit of the present invention.

Third Modified Example

Figure 12:
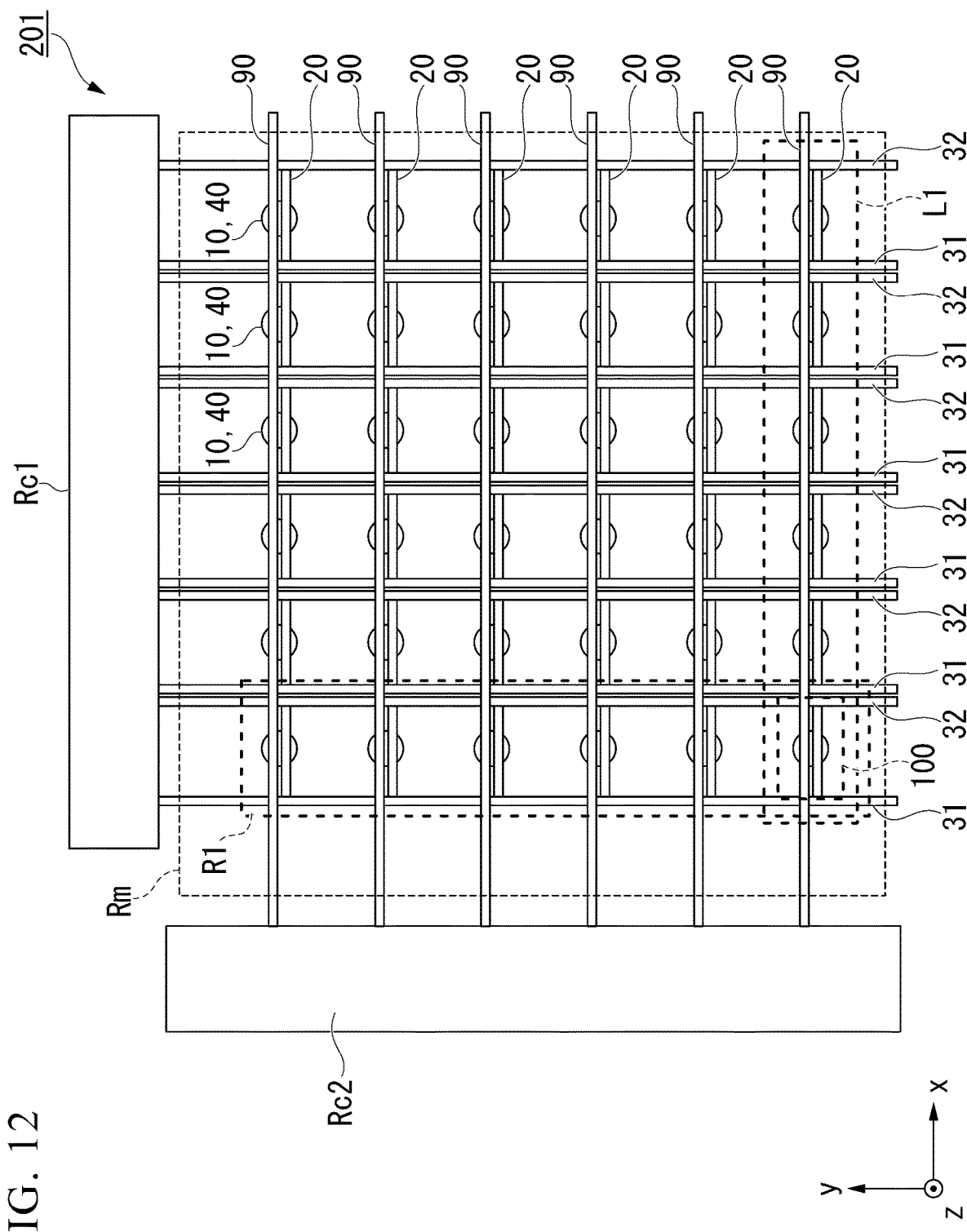
FIG. 12 is a circuit diagram of a modified example of the magnetic memory according to the second embodiment.

FIG. 12 is a circuit of a third modified example of the magnetic memory according to the second embodiment. Components the same as those of the magnetic memory 200 according to the second embodiment will be denoted by the same reference signs and a description thereof will be omitted.

A magnetic memory 201 according to the third modified example 3 is different from the magnetic memory 200 illustrated in FIG. 7 in that the spin-orbit torque wirings in the first element row L1 are not connected to each other, and the first conductive part 31 and the second conductive part 32 are not shared between two adjacent spin-orbit torque magnetoresistance effect elements 100.

Also in the magnetic memory 201 according to the third modified example 3, the number of transistors in the memory region Rm is small, and the spin-orbit torque magnetoresistance effect element 100 is highly integrated.

REFERENCE SIGNS LIST

1 First ferromagnetic layer
2 Second ferromagnetic layer
3 Nonmagnetic layer
10 Element part
20 Spin-orbit torque wiring
20a First surface 20b Second surface
30 Conductive part
31 First conductive part
32 Second conductive part
40 Gate part
41 Gate insulating layer
42 Gate electrode
50 Via wiring
60 Substrate
80 Insulating layer
90 Wiring
100, 101 Spin-orbit torque magnetoresistance effect element
200, 201 Magnetic memory
Tr1 First transistor
Tr2 Second transistor
Tr3 Third transistor
Tr4 Fourth transistor
Tr5 Fifth transistor
Tr6 Sixth transistor
Tr7 Seventh transistor

What is claimed is:

1. A spin-orbit torque magnetoresistance effect element comprising:
an element part including a first ferromagnetic layer, a second ferromagnetic layer, and a nonmagnetic layer positioned between the first ferromagnetic layer and the second ferromagnetic layer;
a spin-orbit torque wiring positioned in a first direction with respect to the element part, facing the first ferromagnetic layer of the element part, and extending in a second direction, the spin-orbit torque wiring including:
a semiconductor; and
a first surface which faces the element part and a second surface opposite to the first surface;
a first conductive part and a second conductive part facing the spin-orbit torque wiring at positions sandwiching the element part when viewed from the first direction, the first conductive part and the second conductive part facing the first surface or the second surface; and
a gate part positioned between the first conductive part and the second conductive part when viewed from the first direction, the gate part facing the second surface and including, in order from a position near the spin-orbit torque wiring:
a gate insulating layer that covers at least a part of the second surface of the spin-orbit torque wiring and covers both a part of the first conductive part and a part of the second conductive part; and
a gate electrode, the gate insulating layer occupying a larger area than the gate electrode when viewed from the first direction.

2. The spin-orbit torque magnetoresistance effect element according to claim 1, further comprising:
a via wiring connected to the second ferromagnetic layer of the element part and extending in the first direction; and
a first transistor electrically connected to the element part by the via wiring.

3. The spin-orbit torque magnetoresistance effect element according to claim 1, wherein the semiconductor constituting the spin-orbit torque wiring is any one selected from the group consisting of Si, SiGe, GaAs, Ge, and InGaAs.

4. The spin-orbit torque magnetoresistance effect element according to claim 1, wherein the spin-orbit torque wiring contains a scattering element.

5. The spin-orbit torque magnetoresistance effect element according to claim 4, wherein the scattering element is a heavy metal element having an atomic number equal to or higher than that of yttrium.

6. The spin-orbit torque magnetoresistance effect element according to claim 4, wherein the scattering element is a magnetic element.

7. A magnetic memory comprising a plurality of spin-orbit torque magnetoresistance effect elements according to claim 1.

8. The magnetic memory according to claim 7, wherein
the plurality of spin-orbit torque magnetoresistance effect elements includes a first element row in which the spin-orbit torque magnetoresistance effect elements are disposed in the second direction, and
two spin-orbit torque magnetoresistance effect elements adjacent to each other in the second direction share the second conductive part of one spin-orbit torque magnetoresistance effect element as the first conductive part of the other spin-orbit torque magnetoresistance effect element in the first element row.

9. The magnetic memory according to claim 7, wherein
the plurality of spin-orbit torque magnetoresistance effect elements includes a first element row in which the spin-orbit torque magnetoresistance effect elements are disposed in the second direction, and
spin-orbit torque wirings of the plurality of spin-orbit torque magnetoresistance effect elements constituting the first element row are connected to each other.

10. The magnetic memory according to claim 8, wherein
the plurality of spin-orbit torque magnetoresistance effect elements further includes a second element row in which the spin-orbit torque magnetoresistance effect elements are disposed in a third direction different from the first direction and the second direction,
first conductive parts of the plurality of spin-orbit torque magnetoresistance effect elements constituting the second element row are connected to each other, and
second conductive parts of the plurality of spin-orbit torque magnetoresistance effect elements constituting the second element row are connected to each other.

11. The spin-orbit torque magnetoresistance effect element according to claim 1, wherein in the second direction, a width of the gate part is larger than a width of the element part.

12. The spin-orbit torque magnetoresistance effect element according to claim 4, wherein an amount of the scattering element is $1 \times 10^{13}$ cm$^{-3}$ or more and $1 \times 10^{18}$ cm$^{-3}$ or less.

* * * * *